United States Patent
Lee et al.

(10) Patent No.: US 10,221,065 B2
(45) Date of Patent: Mar. 5, 2019

(54) CMOS-MEMS INTEGRATED DEVICE INCLUDING MULTIPLE CAVITIES AT DIFFERENT CONTROLLED PRESSURES AND METHODS OF MANUFACTURE

(71) Applicant: INVENSENSE, INC., San Jose, CA (US)

(72) Inventors: Daesung Lee, Palo Alto, CA (US); Jongwoo Shin, Pleasanton, CA (US); Jong Il Shin, San Jose, CA (US); Peter Smeys, San Jose, CA (US); Martin Lim, San Mateo, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/461,270

(22) Filed: Mar. 16, 2017

(65) Prior Publication Data
US 2017/0183225 A1 Jun. 29, 2017

Related U.S. Application Data

(60) Division of application No. 14/603,185, filed on Jan. 22, 2015, now Pat. No. 9,738,512, and a
(Continued)

(51) Int. Cl.
*H01L 23/02* (2006.01)
*B81C 1/00* (2006.01)
(Continued)

(52) U.S. Cl.
CPC .......... *B81C 1/0023* (2013.01); *B81B 7/0038* (2013.01); *B81B 7/0041* (2013.01);
(Continued)

(58) Field of Classification Search
CPC ......... H01L 23/02; H01L 21/54; H01L 29/84; H01L 21/04
(Continued)

(56) References Cited

U.S. PATENT DOCUMENTS

| 5,285,131 A | 2/1994 | Muller et al. |
| 5,493,177 A | 2/1996 | Muller et al. |

(Continued)

FOREIGN PATENT DOCUMENTS

| CN | 101898746 | 12/2010 |
| CN | 103183308 | 7/2013 |

(Continued)

OTHER PUBLICATIONS

Ex Parte Quayle Action dated Jan. 25, 2017 for U.S. Appl. No. 15/265,668, 31 pages.
(Continued)

*Primary Examiner* — Mouloucoulaye Inoussa
(74) *Attorney, Agent, or Firm* — Amin, Turocy & Watson, LLP

(57) ABSTRACT

An integrated MEMS device comprises two substrates where the first and second substrates are coupled together and have two enclosures there between. One of the first and second substrates includes an outgassing source layer and an outgassing barrier layer to adjust pressure within the two enclosures. The method includes depositing and patterning an outgassing source layer and a first outgassing barrier layer on the substrate, resulting in two cross-sections. In one of the two cross-sections a top surface of the outgassing source layer is not covered by the outgassing barrier layer and in the other of the two cross-sections the outgassing source layer is encapsulated in the outgassing barrier layer. The method also includes depositing conformally a second outgassing barrier layer and etching the second outgassing
(Continued)

barrier layer such that a spacer of the second outgassing barrier layer is left on sidewalls of the outgassing source layer.

15 Claims, 16 Drawing Sheets

Related U.S. Application Data continuation-in-part of application No. 13/535,180, filed on Jun. 27, 2012, now Pat. No. 9,540,230.

(60) Provisional application No. 62/061,062, filed on Oct. 7, 2014.

(51) Int. Cl.
  *B81B 7/00* (2006.01)
  *B81B 7/02* (2006.01)

(52) U.S. Cl.
  CPC ............ *B81B 7/02* (2013.01); *B81C 1/00285* (2013.01); *B81B 2201/0228* (2013.01); *B81B 2207/017* (2013.01); *B81C 2203/019* (2013.01); *B81C 2203/035* (2013.01); *B81C 2203/0785* (2013.01)

(58) Field of Classification Search
  USPC ........ 257/415, 414, 416, 417, E23.193, 723, 257/E23.18, E21.501; 438/48–52, 438/455–459, 476
  See application file for complete search history.

(56) References Cited

U.S. PATENT DOCUMENTS

| | | | |
|---|---|---|---|
| 5,531,121 A | 7/1996 | Sparks et al. | |
| 6,046,101 A * | 4/2000 | Dass | H01L 23/291 438/624 |
| 6,936,491 B2 | 8/2005 | Partridge et al. | |
| 7,008,812 B1 | 3/2006 | Carley | |
| 7,075,160 B2 | 7/2006 | Partridge et al. | |
| 7,104,129 B2 | 7/2006 | Nasiri et al. | |
| 7,442,570 B2 | 10/2008 | Nasiri et al. | |
| 8,328,966 B1 | 12/2012 | Laib et al. | |
| 9,067,779 B1 | 6/2015 | Rothenberg | |
| 2003/0231967 A1 | 12/2003 | Najafi et al. | |
| 2004/0077117 A1 | 4/2004 | Ding | |
| 2004/0166385 A1 | 8/2004 | Morse | |
| 2006/0208326 A1 | 9/2006 | Nasiri et al. | |
| 2009/0294879 A1 | 12/2009 | Bhagavat et al. | |
| 2010/0025845 A1 | 2/2010 | Merz et al. | |
| 2011/0079425 A1 | 4/2011 | Baillin et al. | |
| 2011/0121412 A1 | 5/2011 | Quevy et al. | |
| 2012/0043627 A1 | 2/2012 | Lin et al. | |
| 2012/0279302 A1 | 11/2012 | Lim | |
| 2012/0326248 A1 | 12/2012 | Daneman et al. | |
| 2014/0225206 A1 | 8/2014 | Lin et al. | |
| 2015/0129991 A1 | 5/2015 | Lee et al. | |
| 2015/0360939 A1 | 12/2015 | Zhang et al. | |

FOREIGN PATENT DOCUMENTS

| | | |
|---|---|---|
| CN | 103253625 | 8/2013 |
| DE | 102012202183 A1 | 8/2013 |
| TW | I396659 | 5/2013 |

OTHER PUBLICATIONS

Notice of Allowance dated Apr. 13, 2017 for U.S. Appl. No. 15/265,668, 39 pages.
Chinese Office Action dated Jun. 1, 2017 for Chinese Application Serial No. 201510646926.2, 7 pages.
Office Action dated Jul. 27, 2017 for U.S. Appl. No. 15/358,956, 48 pages.
Office Action dated Dec. 23, 2013 for U.S. Appl. No. 13/535,180, 19 pages.
Office Action dated Oct. 7, 2014 for U.S. Appl. No. 13/535,180, 21 pages.
Office Action dated Mar. 27, 2015 for U.S. Appl. No. 13/535,180, 21 pages.
Office Action dated Oct. 7, 2015 for U.S. Appl. No. 13/535,180, 22 pages.
Office Action dated May 6, 2016 for U.S. Appl. No. 13/535,180, 25 pages.
European Search Report dated Mar. 8, 2016 for European Application Serial No. 15188710.6-1504, 8 pages.
Office Action dated Apr. 10, 2014 for U.S. Appl. No. 13/535,180, 31 pages.
Chinese Office Action dated Sep. 23, 2016 for Chinese Application Serial No. 201510646926.2, 7 pages.
Office Action dated Feb. 26, 2016 for U.S. Appl. No. 14/603,185, 27 pages.
Office Action dated Sep. 22, 2016 for U.S. Appl. No. 14/603,185, 32 pages.
Office Action dated Feb. 17, 2016 for U.S. Appl. No. 14/598,138, 31 pages.
Office Action dated Oct. 11, 2016 for U.S. Appl. No. 14/598,138, 16 pages.
Taiwan Office Action dated Mar. 14, 2017 for Taiwan Application No. 104132144, 6 pages (with translation).
Notice of Allowance received for U.S. Appl. No. 14/832,786 dated Jul. 15, 2016, 35 pages.
Office Action dated Jan. 18, 2018 for U.S. Appl. No. 15/358,956, 35 pages.

* cited by examiner

CMOS-MEMS INTEGRATED DEVICE INCLUDING MULTIPLE CAVITIES AT DIFFERENT CONTROLLED PRESSURES AND METHODS OF MANUFACTURE

PRIORITY CLAIM

This patent application is a divisional application that claims priority to U.S. patent application Ser. No. 14/603,185, filed Jan. 22, 2015, entitled "CMOS-MEMS INTEGRATED DEVICE INCLUDING MULTIPLE CAVITIES AT DIFFERENT CONTROLLED PRESSURES AND METHODS OF MANUFACTURE," which is a non-provisional application that claims priority under 35 USC 119(e) to U.S. Provisional Patent Application Ser. No. 62/061,062, filed on Oct. 7, 2014, entitled "METHOD TO CONTROL CAVITY PRESSURE BY USING OUTGASSING SOURCE LAYER AND OUTGASSING BARRIER LAYER ON MEMS INERTIAL SENSOR AND ACTUATOR," and which is a continuation-in-part of U.S. patent application Ser. No. 13/535,180, filed on Jun. 27, 2012, entitled "METHODS FOR CMOS-MEMS INTEGRATED DEVICES WITH MULTIPLE SEALED CAVITIES MAINTAINED AT VARIOUS PRESSURES," the entireties of which are incorporated herein by reference.

TECHNICAL FIELD

The present invention relates generally to CMOS-MEMS integrated devices and more particularly to CMOS-MEMS integrated devices that include multiple enclosures each of which maintain different controlled pressures.

BACKGROUND

One of the challenges in implementing multiple sensors in a single CMOS-MEMS integrated device is to provide more than one enclosure pressure within the chip in order to optimize the performance of each sensor independently. For example, an accelerometer may require a high enclosure pressure to be more immune to acoustic vibrations whereas a gyroscope on the same CMOS-MEMS integrated devices may require a lower enclosure pressure. The present invention addresses such a need.

SUMMARY

An integrated MEMS device and a method of manufacture is disclosed. In a first aspect, the integrated MEMS device includes a first substrate and a second substrate. The first and second substrates are coupled together and have at least two enclosures there between. One of the first and second substrates include an outgassing source layer and an outgassing barrier layer to adjust pressure within the at least two enclosures.

In a second aspect, the method includes depositing and patterning an outgassing source layer and a first outgassing barrier layer on the substrate, resulting in two cross-sections. In one of the two cross-sections a top surface of the outgassing source layer is not covered by the outgassing barrier layer and in the other of the two cross-sections the outgassing source layer is encapsulated in the outgassing barrier layer. The method also includes depositing conformally a second outgassing barrier layer and etching the second outgassing barrier layer such that a spacer of the second outgassing barrier layer is left on sidewalls of the outgassing source layer.

DETAILED DESCRIPTION

Figure 1A:
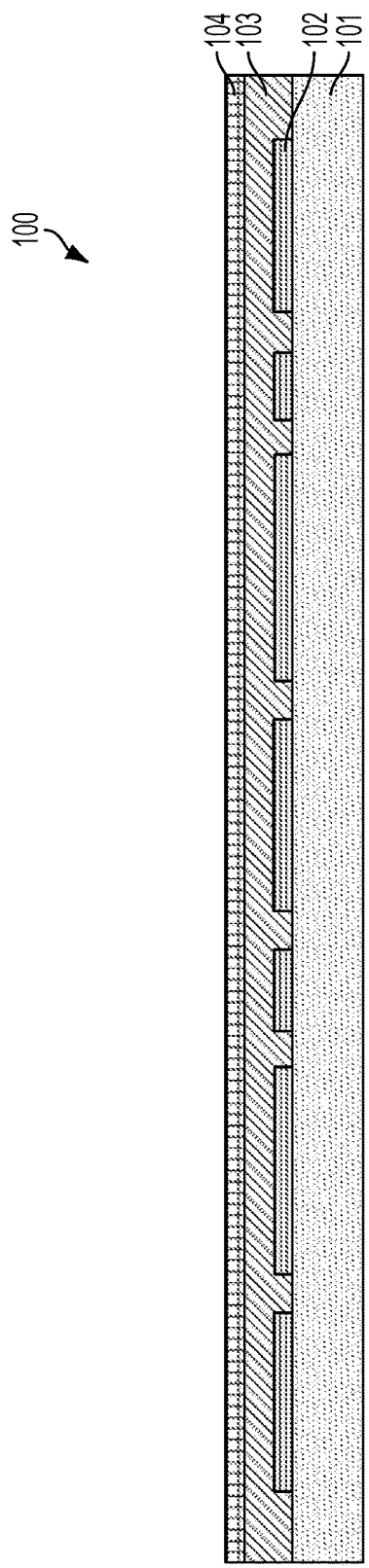
FIGS. 1A-1C illustrates preparation of a CMOS wafer to provide an outgassing function.

The present invention relates generally to CMOS-MEMS integrated devices and more particularly to CMOS-MEMS integrated devices that include multiple enclosures each of which maintain different controlled pressures. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, a method and system in accordance with the present invention is not intended to be limited to the embodiment shown but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, and radio-frequency components. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space. Bond chamber may be an enclosure in a piece of bonding equipment where the wafer bonding process takes place. The atmosphere in the bond chamber determines the atmosphere sealed in the bonded wafers.

Additionally, a system and method in accordance with the present invention describes a class of RF MEMS devices, sensors, and actuators including but not limited to switches, resonators and tunable capacitors that are hermetically sealed and bonded to integrated circuits that may use capacitive sensing and electrostatic, magnetic, or piezo-electric actuation.

In order to achieve multiple enclosure pressures within a CMOS-MEMS integrated device that includes a CMOS wafer wherein there is a substantial difference between the enclosure pressures within each enclosure, the use of an outgassing source and an outgassing barrier layer in the CMOS wafer has been explored. In an enclosure that requires high pressure, an outgassing source layer should be exposed as much as possible; for an enclosure that requires low pressure, the outgassing source layer should be encapsulated in outgassing barrier layer as much as possible. In an embodiment, a pressure in one sealed enclosure may be 50% greater than the pressure in another sealed enclosure.

The processes described below provide for the fabrication of CMOS-MEMS integrated devices using eutectic wafer bonding to create a sealed enclosure between the MEMS and CMOS wafers as well as to make electrical interconnection between the MEMS device and CMOS circuits. A method and system in accordance with the present invention provides for the integration of two or more MEMS devices that require different operating pressures or ambient gasses in operation. For example, MEMS gyroscopes which typically require a low and stable pressure may be integrated with inertial sensors such as accelerometers which require a higher pressure to operate.

In one or more embodiments, a method and system in accordance with the present invention provides for the integration of multiple devices into an integrated CMOS-MEMS process in order to create multiple ambients for multiple devices. It further provides a means for electrical interconnection of the enclosed MEMS devices and, optionally, the capping layer(s) to MEMS structures outside of the enclosure and to a CMOS wafer. A method in accordance with the present invention, in one or more embodiments, in one or more approaches, provides for a method for integrating a second sealed enclosure alongside the main sealed enclosure.

Below are provided a variety of approaches available with a method and system in accordance with the present invention, in one or more embodiments, providing for the integration of such devices into an integrated CMOS-MEMS to create multi-ambient devices. In the described embodiments, the CMOS wafer may be replaced by any suitable capping wafer or substrate.

For each of the embodiments, it will be appreciated that a MEMS structure comprises a MEMS wafer. A MEMS wafer includes a handle wafer with cavities bonded to a device wafer through a dielectric layer disposed between the handle and device wafers. The bonding of the device wafer and subsequent thinning of the device wafer produces an intermediate stage of the process referred to as an Engineered Silicon on Insulator wafer where cavities in the handle wafer are sealed by a layer of the device wafer. The MEMS wafer also includes a moveable portion of the device wafer suspended over a cavity in the handle wafer. The MEMS wafer includes standoffs that are defined by selectively removing areas of the device wafer to product protrusions or standoffs of the device layer.

A germanium material is then disposed over these standoffs and will be used to adhere a CMOS wafer to the MEMS wafer through aluminum to germanium bonding. Prior to bonding the MEMS wafer also includes a moveable portion of the device wafer suspended over a cavity in the handle wafer. These portions are typically defined by a lithographic masking and etch steps.

Outgassing from the CMOS Wafer

Figure 1B:
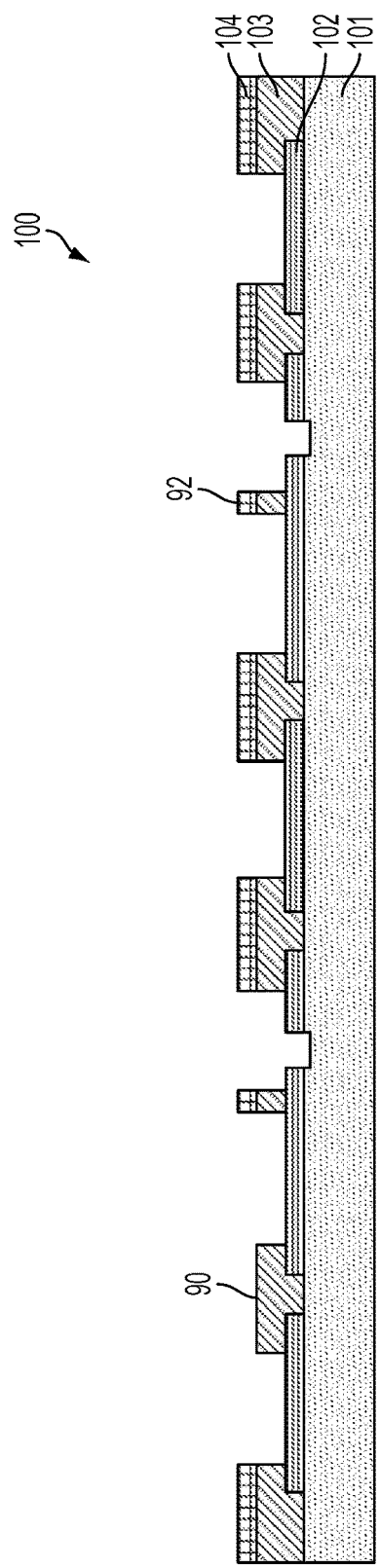
Figure 1C:
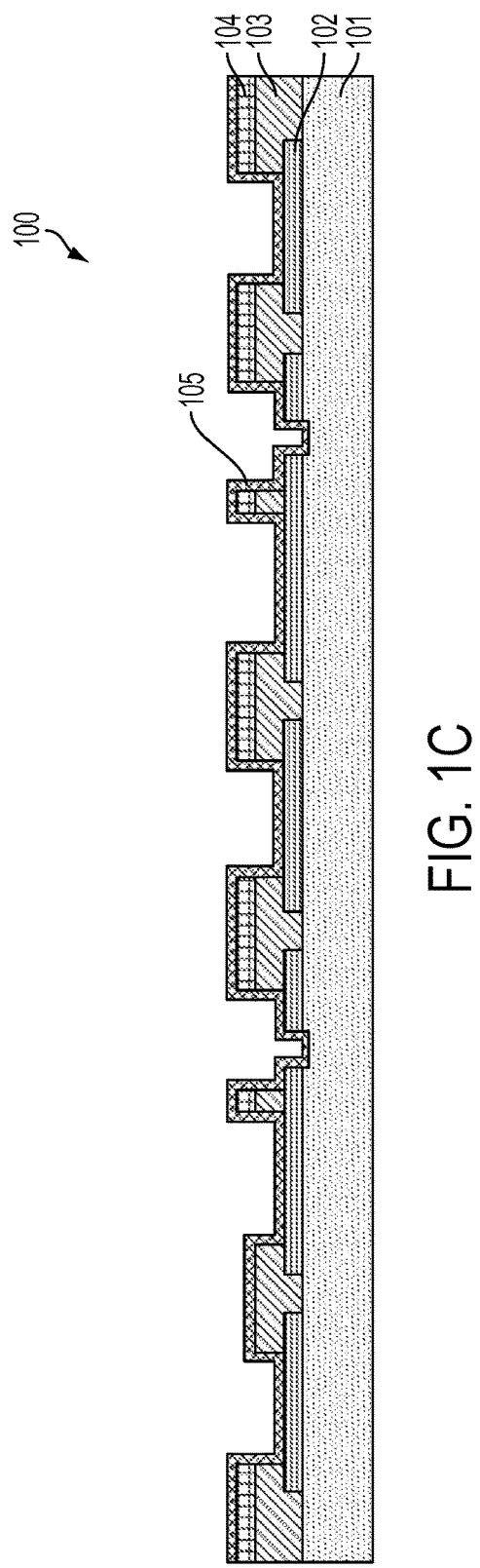

FIGS. 1A-1C illustrates preparation of a CMOS wafer to provide an outgassing function. FIG. 1A illustrates a device 100 that includes an outgassing source layer covered by an outgassing barrier layer(s) on a CMOS wafer to adjust pressure in accordance with a first process. The device 100 in this embodiment includes an intermetal dielectric layer 101, a bonding layer 102 disposed over the intermetal dielectric layer 101, an outgassing source layer 103 disposed over the bonding layer 102 and a first outgassing barrier layer 104 disposed over the outgassing source layer 103. In an embodiment, the intermetal layer 101 comprises for example a dielectric material such as oxide. In an embodiment, the bonding layer 102 comprises for example aluminum. In an embodiment, the outgassing source layer 103 comprises for example an oxide. In an embodiment, the outgassing barrier layer 104 comprises for example silicon nitride.

In this embodiment, for example in FIG. 1B, a left region 90 of the CMOS wafer 100 could support a high enclosure pressure for sensor accuracy therein and the right region 92 of the CMOS wafer could require a lower pressure than region 90 therein for sensor accuracy. FIG. 1A shows patterning of the bonding layer 102 on top of the intermetal dielectric layer 101 in CMOS wafer 100. Then outgassing source layer 103 and the first outgassing barrier layer 104 are deposited sequentially.

FIG. 1B illustrates the CMOS wafer 100 after patterning outgassing source layer 103 and the first outgassing barrier layer 104 using two masks, resulting in two cross-sections comprising: the outgassing source layer 103 only, a stack of outgassing source layer 103 and the first outgassing barrier layer 104. FIG. 1C illustrates conformally coating the CMOS wafer 100 with a second outgassing barrier layer 105. After the conformal coating of the second outgassing barrier layer 105, two different embodiments of process flows can be utilized to provide the finished CMOS wafer for the MEMS-CMOS Integrated device.

Figure 2A:
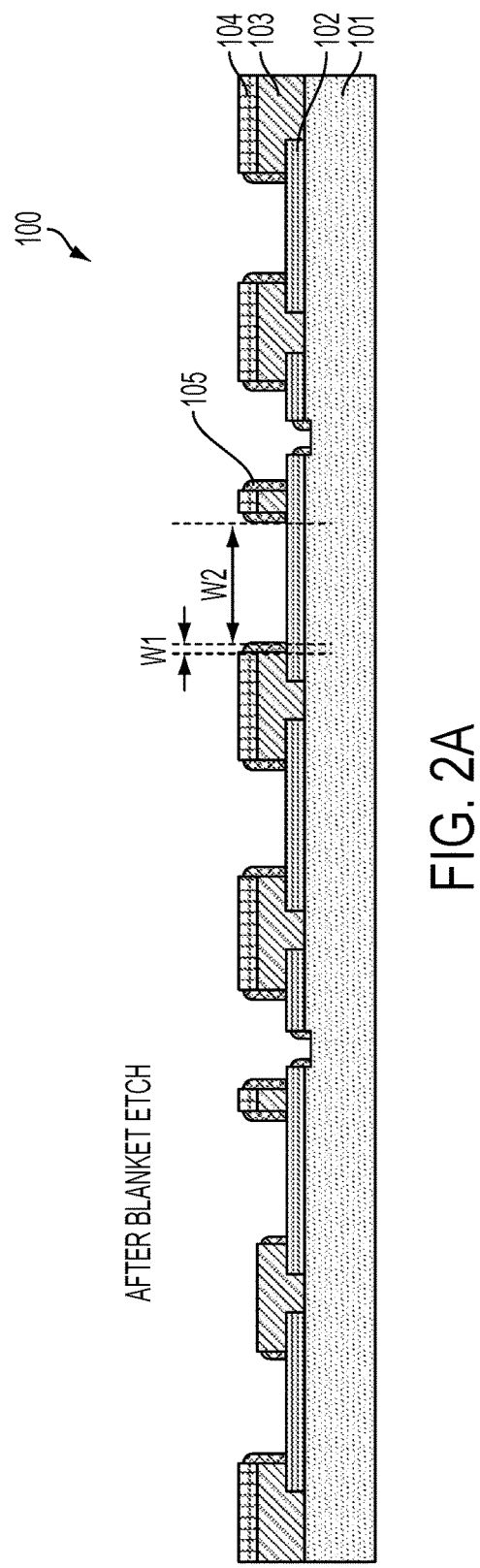
FIG. 2A illustrates the remaining steps of a first embodiment of the first process.

FIG. 2A illustrates a first process flow, wherein the second outgassing barrier layer 105 is blanket etched, leaving a spacer of the second outgassing barrier layer 104 on sidewalls. The portion 90 includes an exposed outgassing source layer 103, while the portion 92 is encapsulated by the first outgassing barrier layer 104 and the second outgassing barrier layer 105. In this embodiment W1 represents a thickness of the second outgassing barrier 105 on the sidewalls and W2 represents a bond pad dimension when coupling a MEMS device thereto.

Figure 2B:
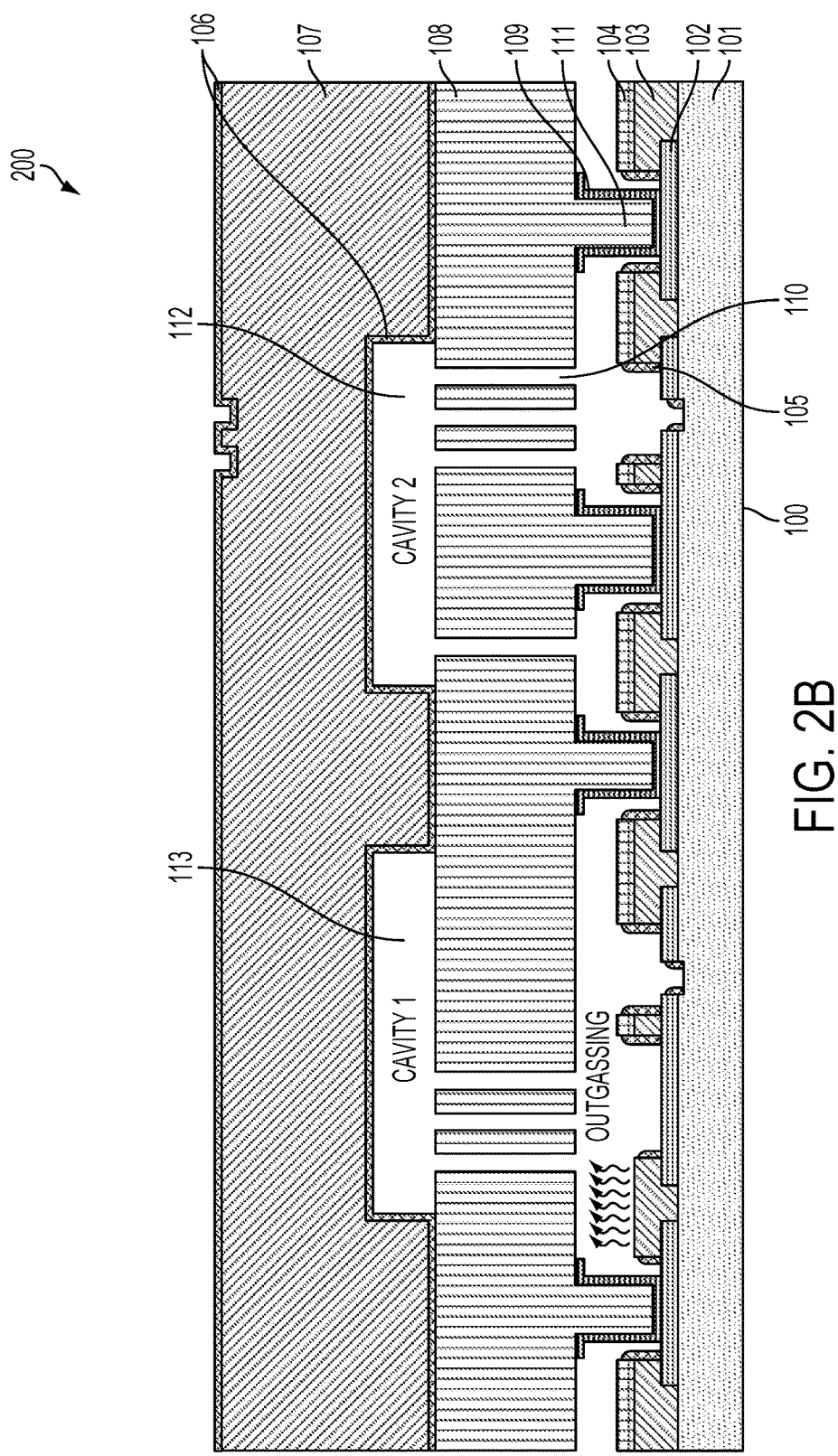
FIG. 2B illustrates a MEMS device bonded to the CMOS wafer formed in accordance with the first embodiment.

FIG. 2B illustrates a MEMS structure 200 formed by bonding a MEMS wafer 110 to the CMOS wafer 100. In the described embodiments, bonding can be any of eutectic bonding between Al and Ge as described in U.S. application Ser. No. 11/084,296, filed on Mar. 18, 2005, now issued as U.S. Pat. No. 7,442,570, entitled "Method of Fabrication of Al/Ge Bonding in a Wafer Packaging Environment and a Product Produced Therefrom," assigned to the applicant of the present application, which is incorporated by reference herein and other bonding techniques including but not limited to, fusion bonding, thermal compression bonding, glass frit, solder, and adhesive bonding. In many embodiments bonding raises the temperature of the bonded structure so as to cause some outgassing. In addition, the bonded structure can be annealed to further facilitate the outgassing process.

The MEMS wafer comprises a MEMS handle wafer 107 which includes first and second cavities coupled to a MEMS device layer 108. A fusion bond layer 106 is between the handle wafer 107 and the device layer 108. The MEMS device layer 108 is in turn coupled to the CMOS wafer 100 via a MEMS bond anchor or standoff 111 that includes metal pads 109. The metal pads 109 in an embodiment comprise a metal such as germanium. In an embodiment an actuator trench 110 is formed in the MEMS device layer 108 and there are first and second sealed enclosures 112 and 113. Sealed enclosure 113 includes an exposed outgassing source layer 103 and enclosure 112 the entire outgassing source layer 103 is encapsulated by the first outgassing barrier layer 104 and the second outgassing layer 105. In an embodiment, to the bonded MEMS structure 300 is annealed. In so doing, outgassing of the structure is provided and allows for improved adjustment of the pressure within the enclosures. In so doing, the enclosures 112 and 113 can be kept at different pressures.

Figure 3A:
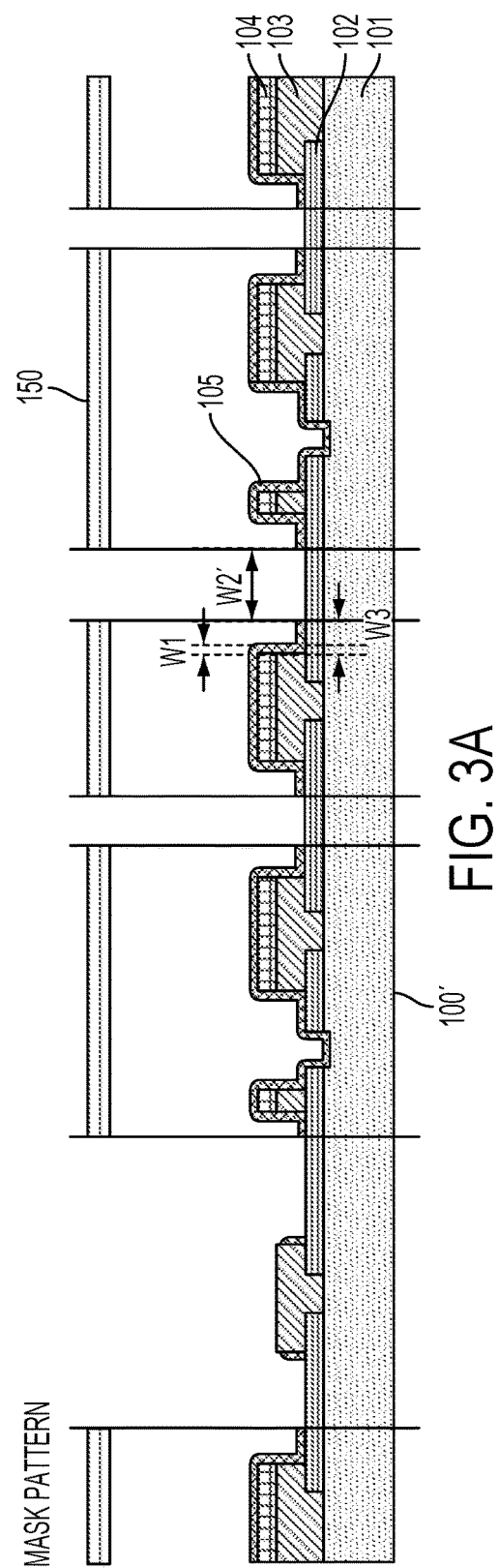
FIG. 3A illustrates the remaining steps for a second embodiment of the first process

FIG. 3A illustrates a second process flow, wherein the second outgassing barrier layer 105 is directionally etched using a mask 150, leaving a spacer of the second outgassing barrier layer 105 on the sidewalls and on the second outgassing barrier layer 105 on top of outgassing source layer 103 bonding layer, and intermetal dielectric layer 101 to allow for the adjustment of pressure.

Figure 3B:
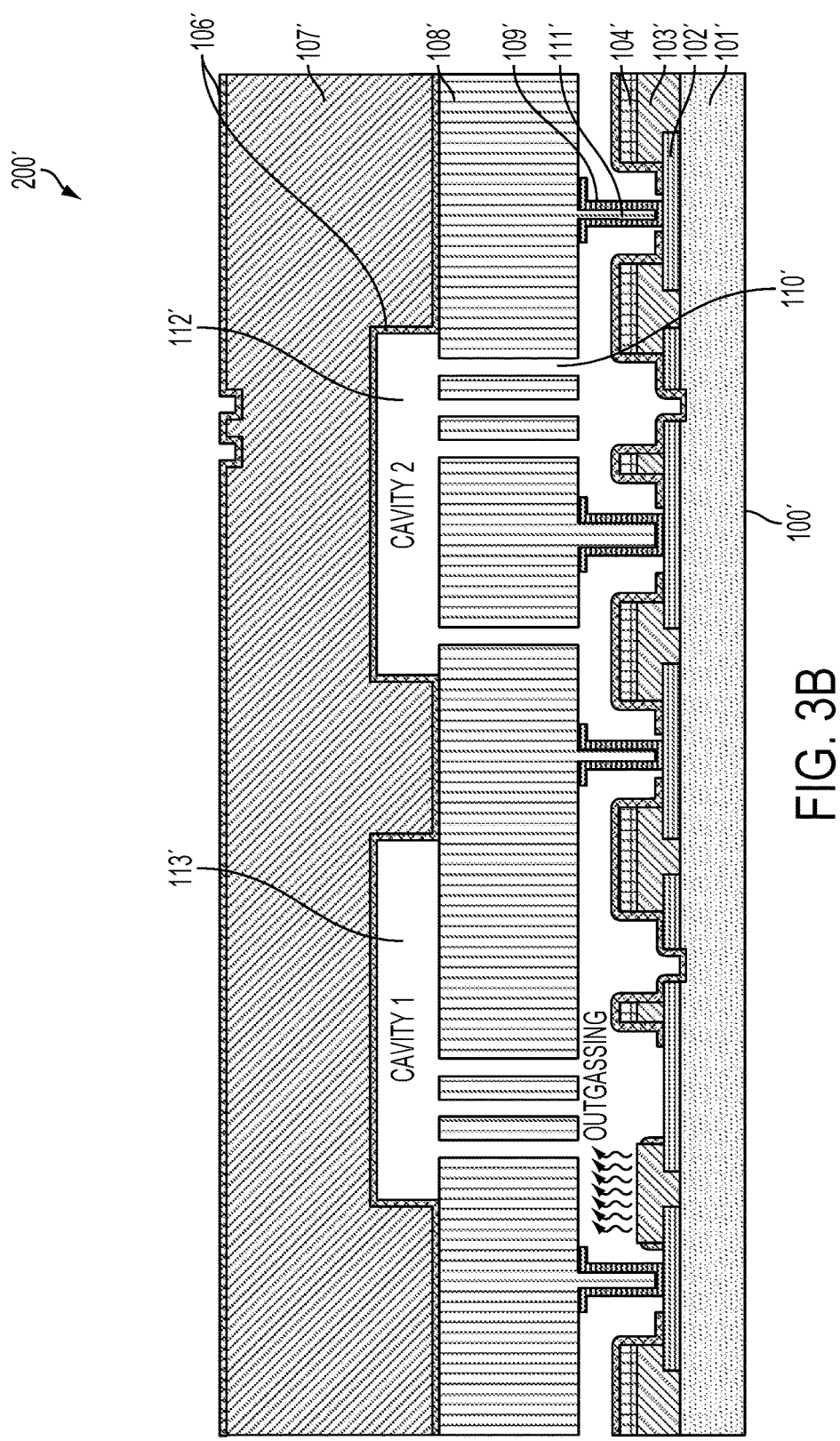
FIG. 3B illustrates a MEMS device bonded to the CMOS wafer formed in accordance with the second embodiment.

FIG. 3B illustrates a MEMS structure 200' formed by bonding a MEMS wafer 110' to the CMOS wafer 100'. The MEMS wafer comprises a MEMS handle wafer 107' which includes first and second sealed enclosures 112' and 113' coupled to a MEMS device layer 108'. The MEMS device layer 108' is in turn coupled to the CMOS wafer 100' via a MEMS bond anchor or standoff 111' that includes metal pads 109'. The metal pads 109'' 109' in an embodiment comprise a metal such as germanium. In an embodiment an actuator trench 110' is formed in the MEMS device layer 108' and there are first and second sealed enclosures 112' and 113'.

The first process flow of FIG. 2A is advantageous over the second process flow of FIG. 3A in that (1) it does not require the additional mask and (2) the bonding dimension with MEMS wafer (W2) is larger than that of the process flow (W2') by 2×W3 where W3 is the mask enclosure. The process flow of FIG. 3A has more margin in the etch step of outgassing barrier layers 105 compared to the process flow of FIG. 2A and can also cover the exposed intermetal dielectric layer 101.

Figure 4A:
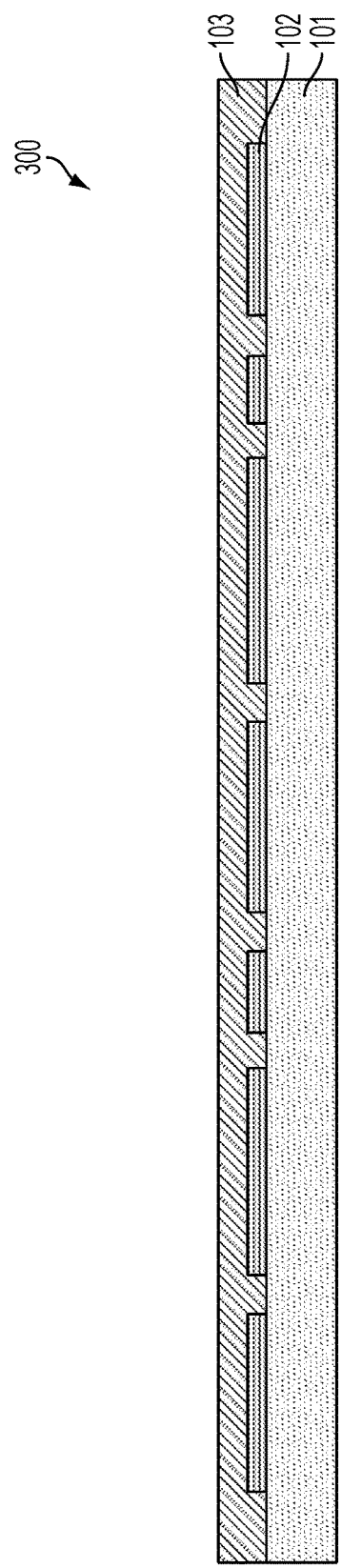
FIGS. 4A-4E illustrate a process flow for an alternative implementation of the CMOS wafer covering the outgassing source layer selectively using an outgassing barrier layer.

FIGS. 4A-4E illustrate a process flow for an alternative implementation of the CMOS wafer 300 covering the outgassing source layer 103 selectively using the outgassing barrier layer 104. The left region 90 represents where a high enclosure pressure is desired and the right region 92 represents where a low enclosure pressure is required. FIG. 4A shows CMOS wafer preparation in which an outgassing source layer 103 is disposed over a bonding layer 102 which is patterned on top of inter-metal dielectric layer 101 in the CMOS wafer 300.

Figure 4B:
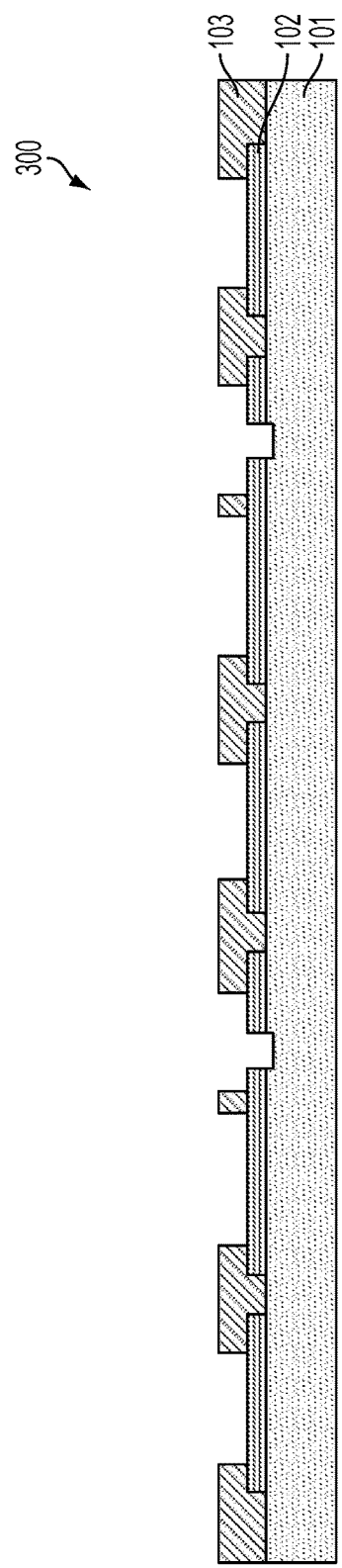
Figure 4C:
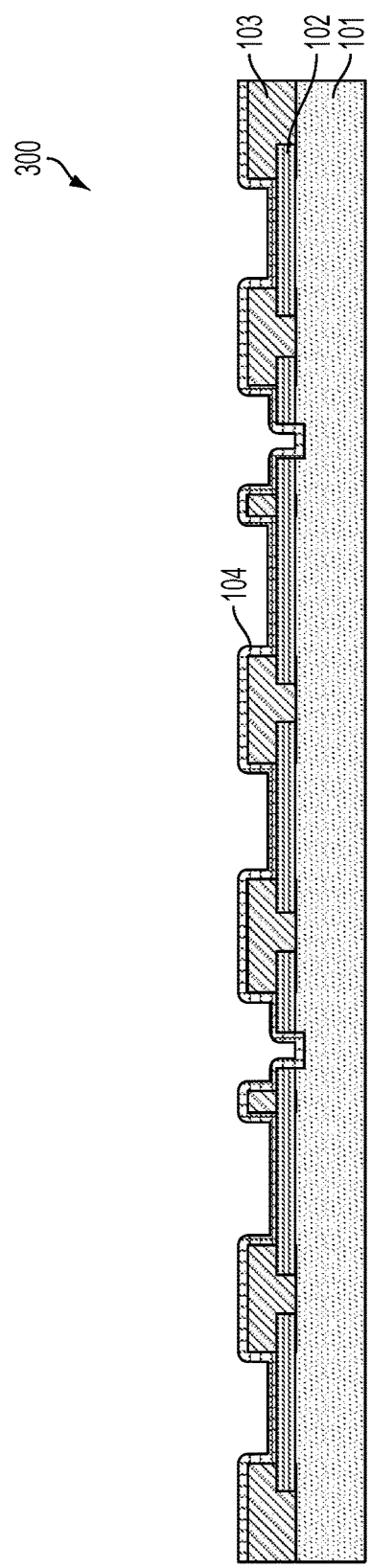
Figure 4D:
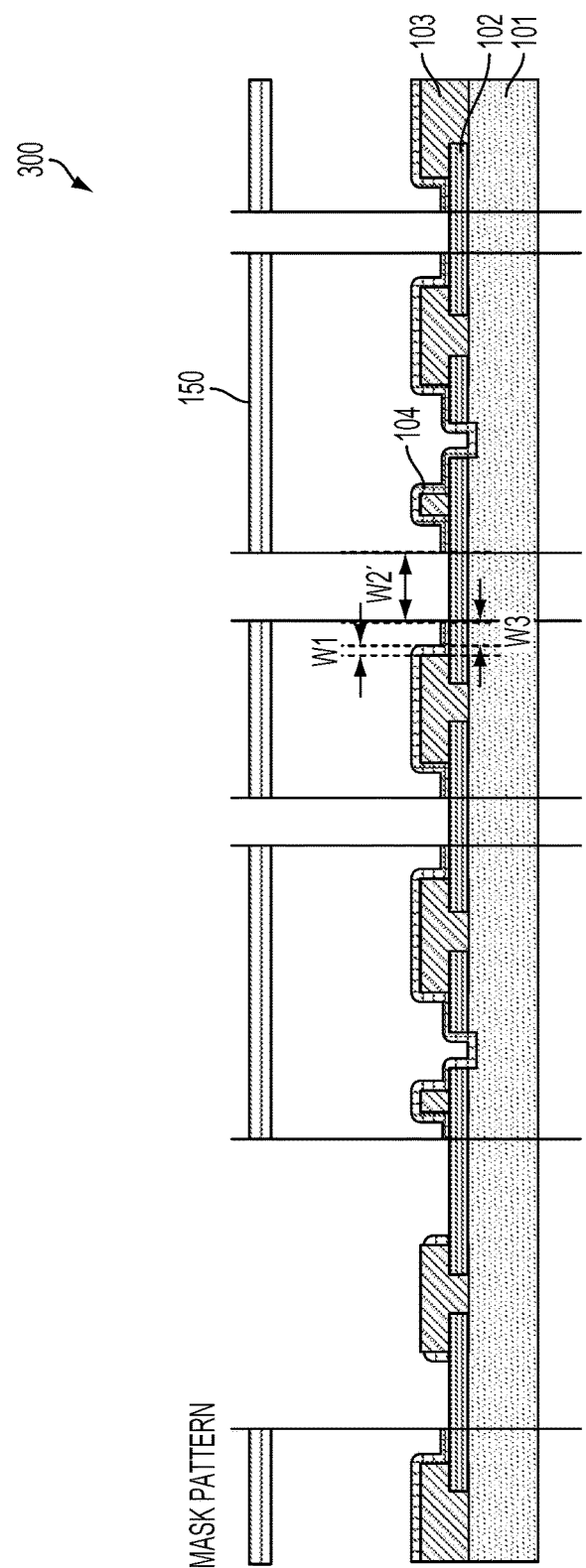
Figure 4E:
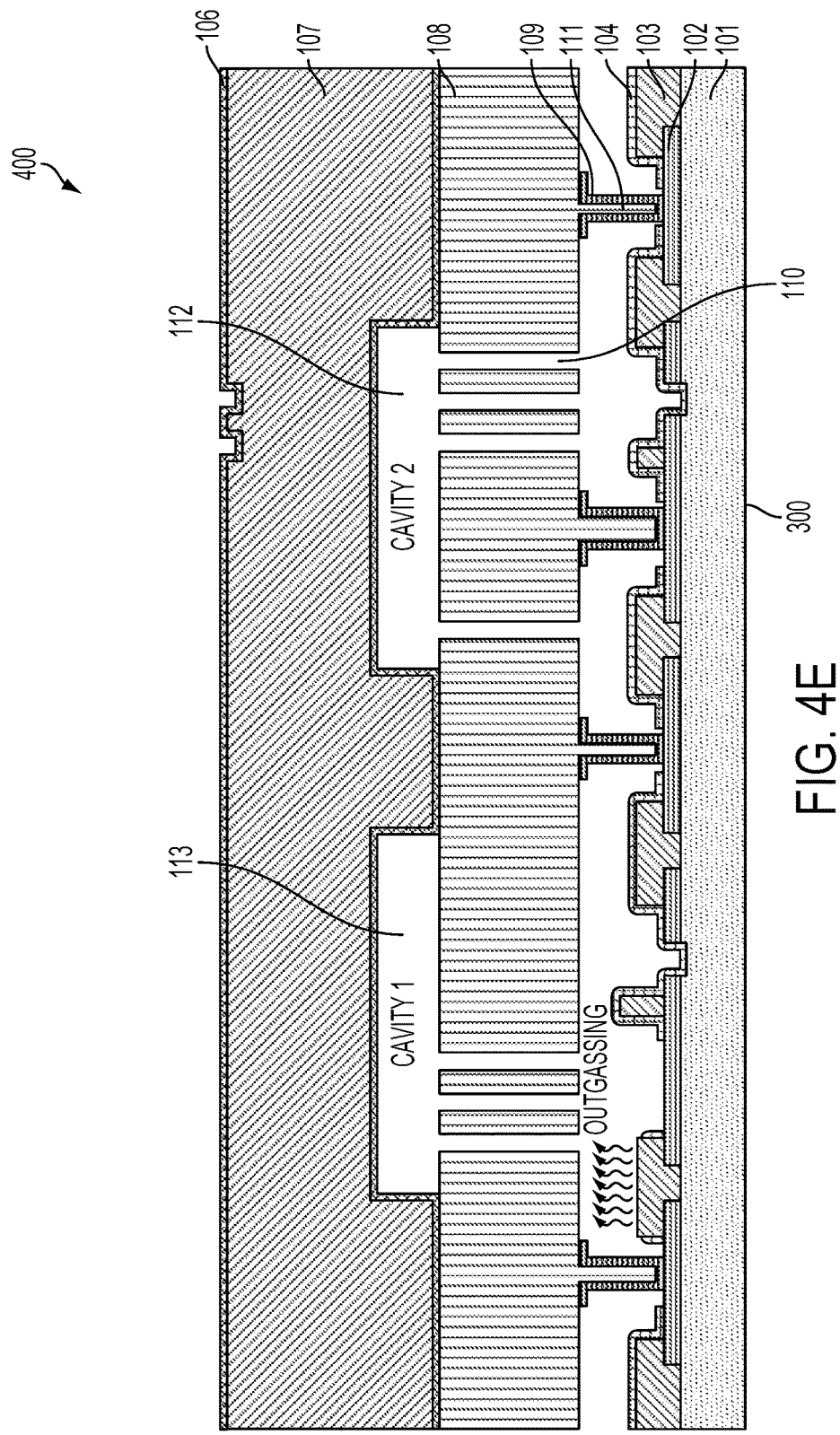

FIG. 4B shows a cross-section after patterning the outgassing source layer 103 using one mask. FIGS. 4C and 4D show the remaining steps. Outgassing barrier layer 104 is deposited conformally and is directionally etched using a mask 150, leaving a spacer of the outgassing barrier layer 104 on the sidewalls and the outgassing barrier layer 104 on top of the outgassing source layer 103, the bonding layer 102, and the intermetal dielectric layer 104. FIG. 4E illustrates a MEMS structure 400 formed by bonding the MEMS wafer 110" to the CMOS wafer 300.

The process flow of FIG. 4A-4E is similar to that of the process flow of FIGS. 3A and 3B in that the final CMOS wafer 300 has a reduced bonding dimension with MEMS wafer compared to that of the process flow 1A. The process of FIGS. 4A-4E requires one less mask compared to the process flow of FIG. 3.

The process flows of FIGS. 2A and 2B, FIGS. 3A and 3B and FIGS. 4A-4E can all be directly extended to providing an intermediate layer between the outgassing source layer and the first outgassing barrier layer. To describe how these process flows may be extended refer now to the following description in conjunction with the accompanying Figures.

Figure 5A:
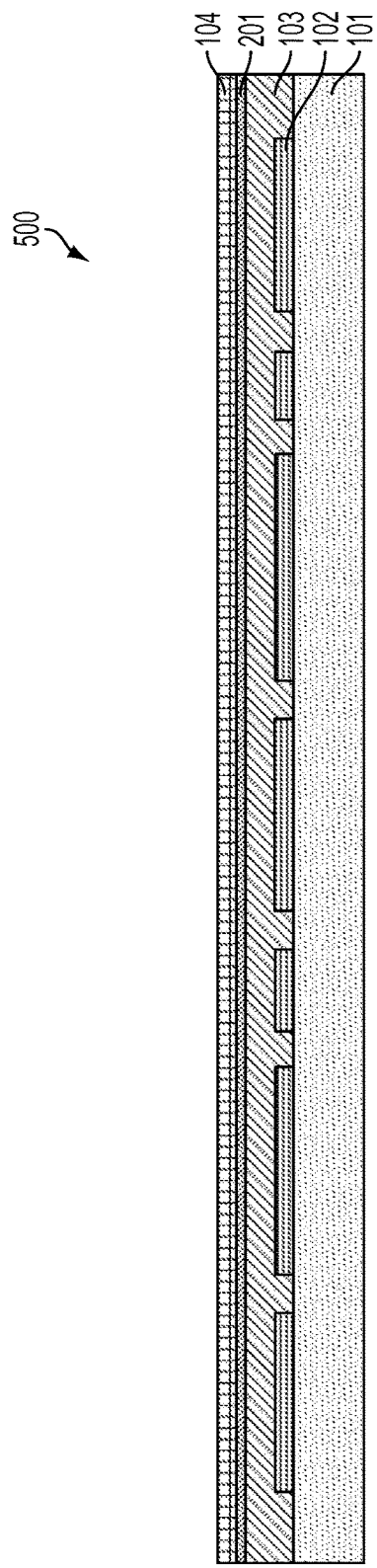
FIGS. 5A and 5B illustrates alternate embodiments for the process flows of FIGS. 2A-2B and FIGS. 3A-3B respectively.
Figure 5B:
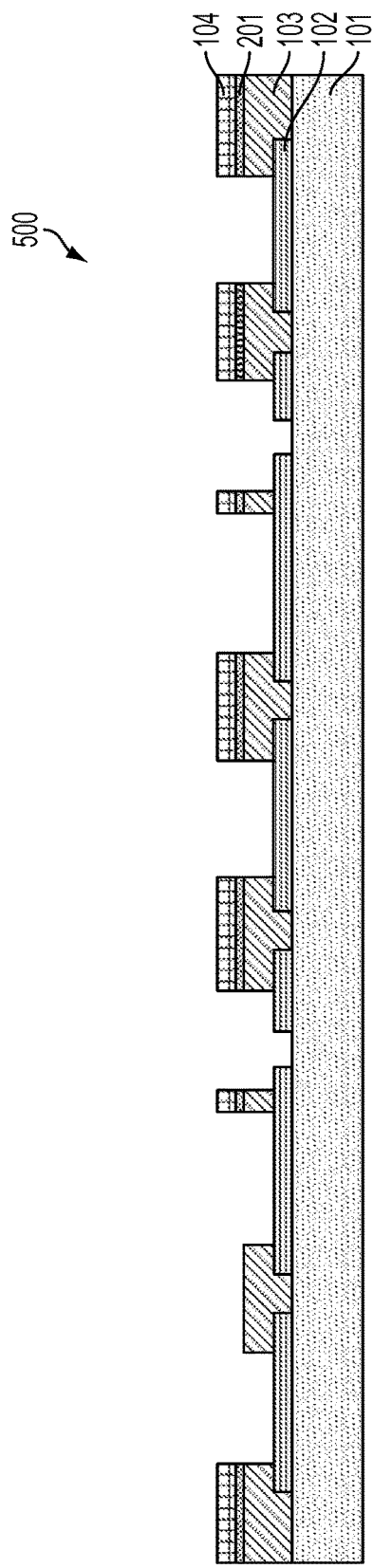

FIGS. 5A and 5B illustrate a process variation from the process flows of FIGS. 2A-2B and FIGS. 3A-3B wherein an intermediate layer is provided. In FIG. 5A an Intermediate layer is deposited on top of outgassing source layer and in FIG. 5B, after the outgassing barrier layer is deposited, the stack of outgassing barrier layer 104 and the intermediate layer 201 is patterned together as shown. Thereafter either the process of FIGS. 2A and 2B or the process of FIGS. 3A and 3B can be utilized to provide the finished CMOS wafer.

Figure 6:
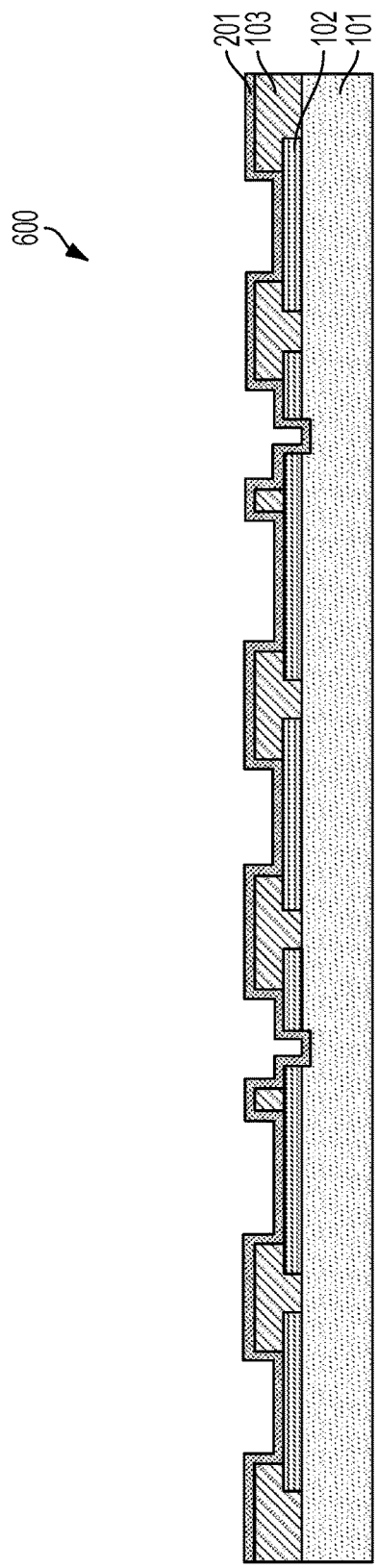
FIG. 6 illustrates an alternate embodiment for the process flow of FIGS. 4A-4E.

FIG. 6 illustrates a process variation from the process flow of FIGS. 4A-4E wherein an intermediate layer is provided after patterning outgassing source layer 103 and after depositing the first outgassing barrier layer 104, the stack of the first outgassing barrier layer 104 and intermediate layer 201 is patterned together. Thereafter the process of FIG. 4A-4E can be utilized to provide the finished CMOS wafer.

Outgassing from the MEMS Wafer

Figure 7:
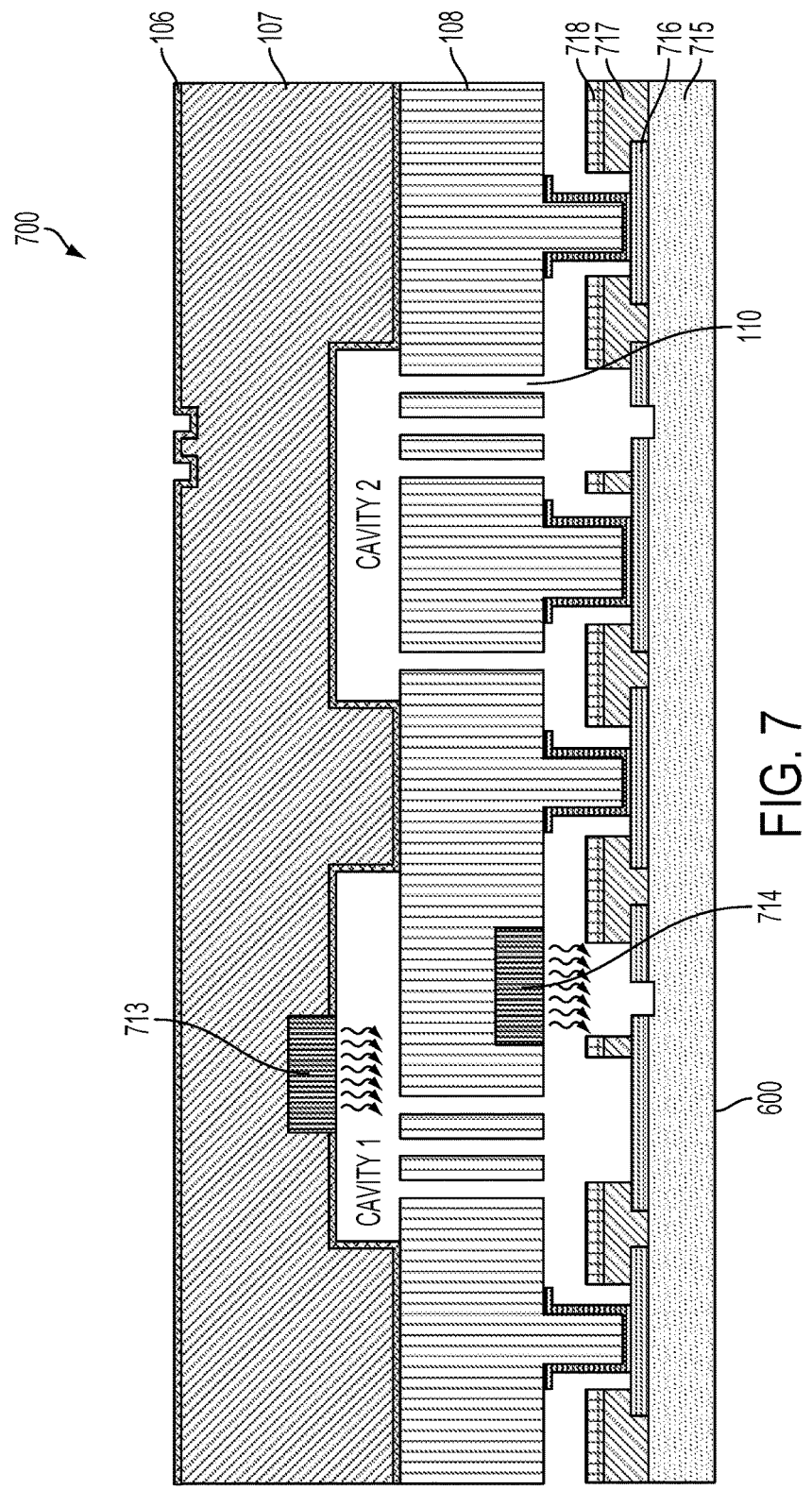
FIG. 7 illustrates providing the outgassing layer within the MEMS wafer of the integrated CMOS-MEMS device for providing the outgassing function.

FIG. 7 illustrates providing the outgassing source layer within the MEMS wafer 110' within an integrated device 700 to allow for the adjustment of pressure within enclosures therein. The CMOS wafer 702 includes an intermetal dielectric layer 715, a bonding layer 716 disposed over the intermetal dielectric layer 715, a first passivation layer 717 disposed over the bonding layer 716 and a second passivation layer 718 disposed over the first passivation layer 717. In an embodiment, the first passivation layer 717 comprises an oxide layer and the second passivation layer 718 comprises a silicon nitride layer. The MEMS wafer 110' has similar elements to those of FIGS. 2B, 3B and 4E and includes similar reference numbers.

To form the outgassing source layers 713 and 714, silicon is patterned (trench etch) and then the trench is filled with the outgassing source layers 713 and 714. Either of the outgassing source layers 713 and 714 or both can be used for providing the outgassing function.

An integrated MEMS device and method in accordance with the present invention is disclosed. The integrated MEMS device includes a first substrate and a second substrate. The first and second substrates are coupled together and have at least two enclosures there between. One of the first and second substrates include an outgassing source layer and an outgassing barrier layer to adjust pressure within the at least two enclosures.

The method includes depositing and patterning an outgassing source layer and a first outgassing barrier layer on the substrate, resulting in two cross-sections. In one of the two cross-sections a top surface of the outgassing source layer is not covered by the outgassing barrier layer and in the other of the two cross-sections the outgassing source layer is encapsulated in the outgassing barrier layer. The method also includes depositing conformally a second outgassing barrier layer and etching the second outgassing barrier layer such that a spacer of the second outgassing barrier layer is left on sidewalls of the outgassing source layer.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method of preparing a substrate, comprising:
depositing and patterning an outgassing source layer and a first outgassing barrier layer on the substrate, resulting in two cross-sections;
depositing conformally a second outgassing barrier layer, wherein in one of the two cross-sections a top surface of the outgassing source layer is not covered by the first and second outgassing barrier layers and in the other of the two cross-sections the outgassing source layer is encapsulated in the first and second outgassing barrier layers;
etching the second outgassing barrier layer such that a spacer of the second outgassing barrier layer is left on at least one sidewall of the outgassing source layer; and
bonding a second substrate to a first substrate comprising the substrate to create bonded substrates and to provide at least one of a first sealed enclosure or a second sealed enclosure, wherein the first sealed enclosure includes one of the two cross-sections, and wherein the second sealed enclosure includes the other of the two cross-sections.

2. The method of claim 1, wherein the depositing and patterning the first outgassing barrier layer comprises depositing the first outgassing barrier layer and etching the first outgassing barrier layer using at least one mask.

3. The method of claim 2, wherein the etching the first outgassing barrier layer using at least one mask comprises selectively exposing the outgassing source layer.

4. The method of claim 1, wherein the bonding the second substrate to the first substrate comprises bonding the second substrate to the first substrate, wherein at least one of the first substrate or the second substrate includes an integrated circuit.

5. The method of claim 4, further comprising:
raising the temperature of the at least one of the first substrate or the second substrate during the bonding.

6. The method claim 5, further comprising:
releasing gas from the outgassing source layer in the at least one of the first sealed enclosure or the second sealed enclosure during the bonding.

7. The method of claim 6, wherein the releasing gas from the outgassing source layer comprises raising the temperature of the outgassing source layer to facilitate the releasing gas.

8. The method claim 6, further comprising:
annealing the bonded substrates to facilitate increasing pressure in the at least one of the first sealed enclosure or the second sealed enclosure.

9. The method claim 8, wherein the increasing pressure in the at least one of the first sealed enclosure or the second sealed enclosure includes increasing pressure in the at least one of the first sealed enclosure or the second sealed enclosure where the outgassing source layer is not covered by either of the first or the second outgassing barrier layers greater than that of the other of the at least one of the first sealed enclosure or the second sealed enclosure where the outgassing source layer is encapsulated in the first and second outgassing barrier layers.

10. The method claim 1, wherein the bonding the second substrate to the first substrate comprises bonding the second substrate to the first substrate with an eutectic bond.

11. The method of claim 1, wherein the depositing and patterning the outgassing source layer comprises depositing a temperature-activated outgassing source layer.

12. The method of claim 11, wherein the depositing the temperature-activated outgassing source layer comprises depositing a non-gettering out-gassing substance in a fixed location on the substrate.

13. The method of claim 12, wherein the depositing the non-gettering out-gassing substance comprises depositing a substance configured to desorb one or more gases as a result of raising its temperature.

14. The method of claim 1, wherein the etching the second outgassing barrier layer comprises directionally etching the second outgassing barrier layer using at least one other mask.

15. The method of claim 1, wherein the etching the second outgassing barrier layer comprises etching the second outgassing barrier layer using a blanket etch.

* * * * *